United States Patent

Uytterhoeven et al.

Patent Number: 5,409,799
Date of Patent: Apr. 25, 1995

[54] METHOD FOR PRODUCING IMAGES USING A PHOTOPOLYMERIZABLE COMPOSITION

[75] Inventors: Herman J. Uytterhoeven, Bonheiden; Rafaël P. Samijn, Wilrijk; Joan T. Vermeersch, Deinze; Yves L. Verburgh, Puurs, all of Belgium

[73] Assignee: Agfa-Gevaert, N.V., Mortsel, Belgium

[21] Appl. No.: 897,936

[22] Filed: Jun. 15, 1992

[30] Foreign Application Priority Data

Jul. 12, 1991 [EP] European Pat. Off. ............ 91201824

[51] Int. Cl.⁶ .......................... G03F 7/11; G03F 7/34
[52] U.S. Cl. ................................. 430/254; 430/257; 430/258; 430/260; 430/287; 430/302; 101/463.1; 101/467
[58] Field of Search .............. 430/271, 252, 253, 254, 430/302, 330, 291, 258, 257, 260, 273, 275, 286, 287; 101/463.1, 467

[56] References Cited

U.S. PATENT DOCUMENTS

| | | |
|---|---|---|
| 2,627,088 | 2/1953 | Alles . |
| 2,993,789 | 7/1961 | Crawford ........................ 430/306 |
| 3,060,024 | 10/1962 | Burg et al. ...................... 430/254 |
| 3,060,026 | 10/1962 | Heian ............................. 430/291 |
| 3,198,633 | 8/1965 | Cohen et al. ................... 430/254 |
| 3,615,435 | 10/1971 | Chu et al. ....................... 430/253 |
| 4,046,577 | 9/1977 | Muzyczko et al. ............. 430/305 |
| 4,050,936 | 9/1977 | Takeda et al. .................. 430/253 |
| 4,081,282 | 3/1978 | Merrill et al. .................. 430/291 |
| 4,175,964 | 11/1979 | Uchida et al. .................. 430/253 |
| 4,225,661 | 9/1980 | Muzyczko ...................... 430/302 |
| 4,288,525 | 9/1981 | Shepard et al. ................ 430/253 |
| 4,355,093 | 10/1982 | Hartmann et al. ............. 430/271 |
| 4,612,270 | 9/1986 | Pampalone et al. ............ 430/273 |
| 4,692,395 | 9/1987 | Findlay .......................... 430/254 |
| 4,925,769 | 5/1990 | Huemmer et al. ............. 430/271 |
| 4,935,331 | 6/1990 | Platzer et al. .................. 430/257 |
| 5,001,036 | 3/1991 | Choi .............................. 430/271 |
| 5,011,754 | 4/1991 | Ono ............................... 430/291 |
| 5,028,512 | 7/1991 | Nagatani et al. ............... 430/271 |
| 5,071,732 | 12/1991 | Köhler et al. .................. 430/271 |

FOREIGN PATENT DOCUMENTS 8100627 2/1981 WIPO ................................ 430/260

Primary Examiner—Charles L. Bowers, Jr.
Assistant Examiner—Martin J. Angebranndt
Attorney, Agent, or Firm—Breiner & Breiner

[57] ABSTRACT

According to the present invention a method is provided for obtaining an image comprising the steps of:

information-wise exposing an imaging element comprising on a support a photosensitive layer containing a photopolymerizable composition and a base layer located between said support and said photosensitive layer and wherein said base layer is contiguous to said photosensitive layer and comprises a polymer containing polymerizable ethylenically unsaturated groups and transferring upon heating the non-hardened or insufficiently hardened parts of said photosensitive layer to an image receiving material. When the image receiving material contains a hydrophilic surface a lithographic printing plate can be obtained.

13 Claims, No Drawings

METHOD FOR PRODUCING IMAGES USING A PHOTOPOLYMERIZABLE COMPOSITION

DESCRIPTION

1. Field of the Invention

The present invention relates to a method for the formation of images by means of photopolymerization and to a method for producing multiple copies of an image. More particularly the present invention relates to an improvement of the resolution of images obtained with said method.

2. Background of the Invention

The use of photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a developing step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poor and J. Willems, Focal Press London-New York, first edition 1978, pages 33 to 39.

The use of the difference in tackiness to obtain an image is described in e.g. U.S. Pat. Nos. 3,060,024, 3,085,488 and 3,649,268. According to the method disclosed in these US patents the image-wise exposed photopolymerizable composition looses its tackiness in the exposed parts while the non-exposed parts keep their tackiness. The non-exposed parts can therefore be colored with dry dye pigments to make the image visible.

According to the methods described in e.g. U.S. Pat. No. 3,245,796 and EP-A 362,827 the diffusibility of a dye is impeded in the photo-exposed parts of the photopolymerizable composition so that during an overall thermal heating subsequent to photo-exposure dye substances in the non-exposed areas will be able to diffuse to a receptor material. According to a similar method described in U.S. Pat. No. 4,587,198 the photopolymerizable composition is made impermeable in the exposed parts for a sublimable dye or dye-pigment present in a layer contiguous to the layer comprising the photopolymerizable composition.

According to a method disclosed in U.S. Pat. No. 3,060,023 the adhesion of the photopolymerizable composition is modified upon image-wise exposure. After image-wise exposure the non-exposed parts will stick or adhere, during a step of overall heating, to a receiving sheet thus allowing the transfer of the non-exposed parts to the receiving sheet.

As illustrated above photopolymerization can be used in a variety of methods to reproduce images. Among these methods several are using dry-developing steps for producing the image which is convenient and offers an ecological advantage. However the resolution of photopolymerizable compositions using a dry-developing step, e.g. a thermal transfer step, show a rather low resolution.

This is especially a problem for the reproduction of halftone images. The reproduction of halftone images using imaging elements comprising a photopolymerizable composition requires the use of halftone screens which consist of a pattern of dots on a support. The coarseness of the image reproduced by such a screen depends on the coarseness of the dot pattern which is commonly measured as the number of lines per inch. The larger the number the finer the image reproduced. Commonly used screens are 65, 70, 85, 100 and 150 lines per inch. Upon exposure the dots of the screen are recorded in the imaging element whereby the size of the recorded dots is determined by the corresponding tone in the original. The dot size in a particular part of a halftone image or printed reproduction is described in terms of percentage value. For example a solid-tone covers 100% of its area, a 50% dot covers half its area and traces of tone in the highlight areas of the original are represented by dots from 2 to 10%. To obtain a good reproduction of a halftone image it is required that the dot sizes from 3% to more than 90% using a 150 lines/inch screen can be recorded by the imaging element.

3. Summary of the Invention

It is an object of the present invention to obtain images of high resolution using an imaging element comprising a photopolymerizable composition said imaging element being developable using a heating step.

It is another object of the present invention to obtain a lithographic printing plate having a high resolution using an imaging element comprising a photopolymerizable composition said imaging element being developable using a heating step.

Further objects of the present invention will become clear from the description hereinafter.

According to the present invention a method is provided for obtaining an image comprising the steps of:
  information-wise exposing an imaging element comprising on a support a photosensitive layer containing a photopolymerizable composition and a base layer located between said support and said photosensitive layer and wherein said base layer is contiguous to said photosensitive layer and comprises a polymer containing polymerizable ethylenically unsaturated groups and
  transferring upon heating the non-hardened or insufficiently hardened parts of said photosensitive layer to an image receiving material.

According to the present invention a method is provided for obtaining a lithographic printing plate comprising the steps of:
  information-wise exposing an imaging element comprising on a support a photosensitive layer containing a photopolymerizable composition and a base layer located between said support and said photosensitive layer and wherein said base layer is contiguous to said photosensitive layer and comprises a polymer containing polymerizable ethylenically unsaturated groups and
  transferring upon heating the non-hardened or insufficiently hardened parts of said photosensitive layer to an image receiving material having a hydrophilic surface.

According to the present invention there is also provided an imaging element comprising on a support a photosensitive layer containing a photopolymerizable composition, a base layer located between said support and said photosensitive layer and wherein said base layer is contiguous to said photosensitive layer and comprises a polymer containing polymerizable ethylenically unsaturated groups and a porous layer containing a pigment on top of said photosensitive layer.

4. Detailed Description of the Invention

It has been found by the inventors that images of high resolution can be obtained according to the method of the present invention using an imaging element containing a base: layer comprising a polymer containing polymerizable ethylenically unsaturated groups and that is provided contiguous to a photosensitive layer comprising a photopolymerizable composition and that is located between the support and the photosensitive layer. More precisely it has been found that tones of a halftone image corresponding to dot sizes up to 95% can be reproduced with a fine dot pattern screen e.g. a 150 lines per inch screen using such an imaging in the method of the present invention. When the base layer used in the imaging element according to the present invention is left out or does not comprise a polymer containing polymerizable ethylenically unsaturated groups the maximum range of tones that can be reproduced with a fine dot pattern screen from a halftone image is between 3% and 80%.

Suitable base layers for use in accordance with the present invention are layers having a good adherence to the support of the imaging element. For improving the adherence of the base layer the support may be coated with so-called subbing layers.

Examples of polymers containing polymerizable ethylenically unsaturated groups comprised in said base layer are polymers comprising vinyl groups, allyl groups, (meth)acrylate groups, butadiene groups, isoprene groups etc., e.g. acrylated epoxies, polyester acrylates, urethane acrylates etc..

Said polymers containing polymerizable ethylenically unsaturated groups may be prepared by modification of polymers e.g. modification of polymers containing hydroxyl groups e.g. polyvinyl alcohol, polyesters with hydroxyl functions, copolymers of styrene and allylalcohol, phenoxy resins, cellulose, dextranes etc. with carboxilic acid or acid halides, modification of polymers containing epoxy groups with diallylamine, modification of polymers containing amino groups, isocyanate groups, anhydride groups, alkyl chloride groups, silanol groups etc..

The base layer used in accordance with the present invention preferably also contains polymerization initiators. According to the present invention initiators can be used that can be activated thermally or photochemically. The latter are however preferred. Examples of initiators suitable for use in accordance with the present invention include the substituted or unsubstituted polynuclear quinones which are compounds having two intracyclic carbonyl groups attached to intracylic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methyl anthraquinone, 2-tert-butyl anthraquinone, octamethylanthraquinone, 1,4-naphtoquinone, 9,10-phenanthrenequinone, 1-2 benzanthraquinone, 2,3-dichloronaphthoquinone, sodium salt of anthraquinone alpha-sulfonic acid, 3-chloro-2-methylanthraquinone, and 1,2,3,4-tetrahydrobenzene a anthracene-7,12-dione. The photointiators which are also useful are described in Plambeck U.S. Pat. No. 2,760,863 and include vicinal ketaldonyl compounds, such as diacetyl, benzil, etc. alpha-ketaldonyl alcohols, such as benzoin, pivalon, etc. acyloin ethers e.g. benzoin methyl and ethyl ethers, etc.; alpha-hydrocarbon substituted aromatic acyloins, including methylbenzoin, alpha-allylbenzoin, and alpha-phenylbenzoin. Still further photoinitiators useful in accordance with the present invention are those disclosed in "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol. 59,N° 751, August 1987, pages 97–106, in EP-A 362,827, and in U.S. Pat. No. 3,558,309.

Said base layer may further comprise other additives e.g. binding agents or polymers to improve the adhesion of said layer to the support and/or other optional layers between the support and said base layer.

According to the method of the present invention for obtaining an image an imaging element according to the present invention is information-wise exposed to actinic radiation to harden the photopolymerizable composition pattern-wise in correspondence to the information-wise distribution of actinic radiation. The exposure can be a contact exposure using e.g ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

Subsequent to the information-wise exposure the image is developed by transfer of the non-hardened or insufficiently hardened parts of the photosensitive layer upon heating to an image-receiving material. Said heating may be applied to either or both: the imaging element or receiving material while or before bringing both materials in contact with each other. In an alternative embodiment of the present invention the image-receiving material and imaging element may form an integral element and are peeled apart after information-wise exposure and thermal transfer.

The photopolymerizable composition comprised in the photosensitive layer preferably contains urethane type monomers as disclosed in EP-A-91200468.6. These type of monomers offer the advantage that they show a rapid polymerization and solidify even at low conversions of less than 10%. Examples of urethane type monomers are:

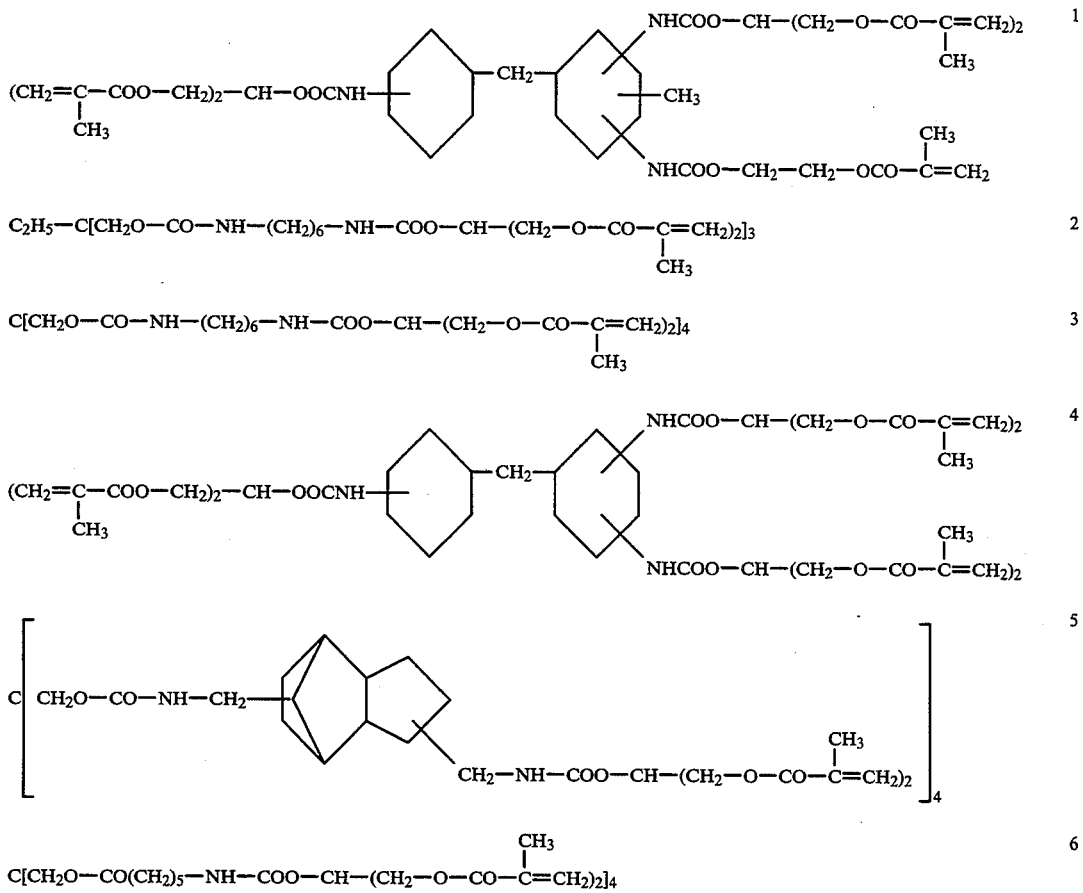

$C[CH_2O—CO(CH_2)_5—NH—COO—CH—(CH_2—O—CO—\underset{\underset{CH_3}{|}}{C}=CH_2)_2]_4$  6

Other types of monomers suitable for use in the photopolymerizable composition used in accordance with the present invention are e.g. the monomers disclosed in DEOS no. 4,005,231, 3,516,256, 3,516,257 and 3,632,657, unsaturated esters of polyols, particularly such esters of the alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4obenzenediol di(meth)acrylate, pentaerythritol tetra(meth)acrylate, 1,5-pentanediol di(meth)acrylate, the bis acrylates and methacrylates of polyethylene glycols of molecular weight 200–500, and the like : unsaturated amides, particularly those of the alphamethylene carboxylic acids, and especially those of alpha-omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc.. It will be clear that these monomers and/or polymers and/or oligomers can be used in admixture.

The photopolymerizable composition used in accordance with the present invention also comprises at least one photoinitiator. Preferably used photoinitiators are polymerization initiators activatable by actinic light and thermally inactive at and below 185° C. Examples of such initiators include the substituted or unsubstituted polynuclear quinones which are compounds having two intracyclic carbonyl groups attached to intracylic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methylanthraquinone, 2-tert-butyl anthraquinone, octamethyl anthraquinone, 1,4-naphtoquinone, 9,10-phenanthrenequinone, 1-2 benzanthraquinone, 2,3-dichloronaphthoquinone, sodium salt of anthraquinone alpha-sulfonic acid, 3-chloro-2-methylanthraquinone, and 1,2,3,4-tetrahydrobenzene a anthracene-7,12-dione. The photointiators which are also useful are described in Plambeck U.S. Pat. Nos. 2,760,863 and include vicinal ketaldonyl compounds, such as diacetyl, benzil, etc. alpha-ketaldonyl alcohols, such as benzoin, pivalon, etc. acyloin ethers e.g. benzoin methyl and ethyl ethers, etc.; alpha-hydrocarbon substituted aromatic acyloins, including mehtylbenzoin, alpha-allylbenzoin, and alpha-phenylbenzoin. Still further photoinitiators useful in accordance with the present invention are those disclosed in "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol.59,N° 751, August 1987, pages 97–106, in EP-A 362,827, and in U.S. Pat. No. 3,558,309.

According to the present invention thermal polymerization inhibitors may also be added to the photopolymerizable composition. Inhibitors for use in accordance with the present invention are p-methoxyphenol, hydroquinone, alkyl and acyl-substituted hydroquinones and quinones, tert-butylcatechol, pyrogallol, copper resinate, naphtylamines, beta-naphtol, cuprous chloride, 2,6-di-tert-butyl p-cresol, photothiazine, pyridine, nitrobenzene and dinitrobenzene, p-toluquinone and chloranil.

According to a preferred mode of the present invention the photosensitive layer containing the photopolymerizable composition is a thermoplastic layer comprising a thermoplastic polymer. Said thermoplastic layer is preferably solid at temperatures below 40° C. and is transferable in the non-exposed or insufficiently exposed parts at temperatures between 40° C. and 250° C.

Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Poly(meth)acrylate and alpha-alkyl poly(meth)acrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

To the thermoplastic polymer constituent of the photosensitive layer there can be added non-thermoplastic polymeric compounds to give certain desirable characteristics, e.g., to improve adhesion to said base layer used in accordance with the present invention, adhesion to the receptor support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the photopolymerizable layer. The fillers are useful in improving the strength of the composition, reducing tack and in addition, as coloring agents.

Agents to improve the wetting and/or adjust the adhesion of the thermoplastic layer may be added. Suitable agents are e.g. silicons, silicon containing polymers e.g. a poly(dimethylsiloxane)-polyether copolymer, poly(dimethylsiloxane)-polyester, silicon containing surfactants, fluor containing copolymers and fluor containing surfactants etc..

Various dyes, pigments, thermographic compounds, UV-absorbers, antioxidants and color forming components can be added to the photopolymerizable compositions to give a variety of results after the thermal transfer. These additive materials, however, preferably should not absorb excessive amounts of light at the exposure wavelength or inhibit the polymerization reaction.

Among the dyes useful in the invention are Fuchsine (C.I. 42510), Auramine Base (C.I. 410003), Calcocid Green S (C.I. 44000), Para Magenta (C.I. 42500), Tryparosan (C.I. 42505), New Magenta (C.I. 42520), Acid Violet RRL (C.I. 42425), Red Violet 5RS (C.I. 42960), C.I. Solvent Blue 36 (C.I. 61551), Nile Blue 2B (C.I. 51185), New Methylene Blue GG (C.I. 51195), C.I. Basic Blue 20 (C.I. 42585, Iodine Green (C.I. 42556), Night Green B (C.I. 42415), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphtalene Black 12R (C.I. 20350), Fast Black L (C.I. 51215), and Ethyl Violet (C.I. 42600).

Suitable pigments include, e.g. $TiO_2$, colloidal carbon, graphite, phosphor particles, ceramics, clays, metal powder such as aluminium, copper, magnetic iron and bronze, etc. The pigments are useful when placed in the photosensitive layer or in an adjacent non-photosensitive layer e.g. on top of the photosensitive layer.

The above described dyes or pigments may also be present in said base layer.

Useful thermographic additives, e.g. 3 cyano-4,5-dimethyl-5-hydroxy-3-pyrrolin-2-one, and activators, e.g. copper acetate, are disclosed in the application of Holland and Wayrynen, Ser. No. 807,761, filed Apr. 21, 1959, and the following U.S. Pat. Nos.: 2,825,494, 2,637,657, 2,665,654, 2,663,655, 2,663,656, and 2,663,657.

Suitable color-forming components which form colored compounds on the application of heat or when brought in contact with other color forming components in a receptor material are e.g.:

(1) Organic and inorganic components: dimethyl glyoxime and nickel salts; phenolphtalein and sodium hydroxide; starch/potassium iodide and oxidizing agent, i.e. peroxides, phenols and iron salts; thioacetamide and lead acetate, silver salt and reducing agent, e.g. hydroquinone.

(2) Inorganic components: ferric salts and potassium thiocyanate; ferrous salts and potassium ferricyanide; copper or silver salts and sulfide ions; lead acetate and sodium sulfide.

(3) Organic components: 2,4-dinitrophenylhydrazine and aldehydes or ketones; diazonium salt and phenol or naphtol, e.g. benzenediazonium chloride and B-naphtol; p-dimethylaminobenzaldehyde and p-diethylaminoaniline.

Suitable supports of the imaging element for use in accordance with the present invention are supports that are stable at the heating temperatures necessary for transfering the non-exposed or insufficiently exposed parts of the photopolymerizable composition to the receiving material. Examples of useful supports are e.g. polyester film supports e.g. polyethylene terephthalate, glass, wood, paper, polyethylene coated paper, cellulose esters e.g. cellulose acetate, cellulose propionate, cellulose butyrate, poly carbonate, polyvinyl chloride, polyimide, polypropylene etc.

The receiving material to which the image is transferred must also be stable at the process temperature. The particular material used is dependant on the adhesion of the image to the support of the imaging element. Suitable receiving materials include paper, cardboard, metal sheets, foils and meshes e.g. aluminium, copper, steel, bronze etc., polyethylene, polyester film supports e.g. polyethylene terephthalate, opaque foamed or pigmented polyester, cellulose esters, silk, cotton, viscose rayon fabrics or screens, polycarbonate, polyvinyl chloride, polypropylene, polyethylene coated paper, supports provided with a thin metal layer e.g. polyester supports provided with a vapour deposited metal layer etc..

The surface of the receiving material may be a hydrophilic surface, a layer showing preferential adhesion towards the non-exposed parts of the layer containing the photopolymerizable composition or contain on its surface compounds that react with compounds being transferred so as to produce difference in color, hydrophilicity, conductivity etc. at the surface of the receiving material corresponding to the exposed and non-exposed parts.

The imaging element and receiving material may also be brought in contact before exposure or may be present in one element as described above. Such an element is called a monosheet material and requires that either its back or its front is transparant for the radiation used for the exposure of the photopolymerizable composition.

In a pratical embodiment of the present invention the receiving material contains a hydrophilic surface. Transfer of the non-exposed or insufficiently exposed parts of the photopolymerizable composition to a receiving material having a hydrophilic surface will thus result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

After transfer of the non-exposed or insufficiently exposed parts of the photopolymerizable composition to the receiving material it may be advantageous to overall expose the transferred image to light and/or heat to enhance the stability of the transferred image. Such a procedure is especially preferred when the transferred image is used as a printing master as described above or to improve the scratch resistance of the transferred image.

Receiving materials having a hydrophilic surface are e.g. metal supports like Al or Zn, polyester film supports and paper bases. These supports, if not sufficient hydrophilic by themselves, are first coated with a hydrophilic layer. A particularly suitable hydrophilic layer is a layer of polyvinyl alcohol hardened with a tetraalkyl orthosilicate e.g. tetramethylorthosilicate or tetraethylorthosilicate containing $TiO_2$ as disclosed in e.g. U.S. Pat. No. 3971660.

A preferably used metal support is aluminium. Suitable aluminium supports for use in accordance with the present invention are aluminium foils made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a centre line average value expressed in $\mu m$ and preferably varies from about 0.2 to about 1.5 $\mu m$.

The anodization of the aluminium foil can be performed in electrolytes e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.0 $\mu m$.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed, The anodic surface of the aluminium foil can thus be rinsed with water at 70°–100° C. or with steam. The hot sealing water may comprise additives e.g. nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. Pat. No. 3,861,917 and in the documents referred to therein.

The method of the present invention can also be employed for producing an electrostatic printing master. According to this mode the image-wise exposed photopolymerizable composition used in accordance with the present invention is transferred to a receiving material having a conductive surface or a surface containing compounds that react with compounds being transferred so as to produce an image-wise differentiation in conductivity. Preferably a receiving material carrying a conductive surface e.g. a polyethylene terephthalate support provided with a metallic layer of e.g. aluminium is used. After the transfer of the image-wise exposed photopolymerizable composition to such a material the parts where no transfer took place, corresponding to the exposed parts of the photopolymerizable composition contained in the imaging element, remain conductive while the other parts nave become non-conductive. An electrostatic printing master can thus be obtained.

The receiving material may be a support provided with a metal layer e.g. copper. A printed circuit can thus be produced in a subsequent etch treatment where the image-wise transferred photopolymerizable composition serves as a resist.

According to another mode of the Firesent invention color images can be prepared. According to this mode at least three imaging elements comprising respectively a yellow, magenta and cyan dye or dye pigment in or underneath a photopolymerizable composition used in accordance with the present invention, are image-wise exposed with respectively the blue, green and red color selection of the image. Optionally a fourth imaging element comprising a black dye or dye pigment can be used. Each of these imaging elements is successively heated in contact with the same receiving material e.g. a paper material to allow the transfer of each of the different color selections of the image. It is obvious that the transfer of the different color parts of the image must be carried out in register to obtain a faithful reproduction of the original image.

According to a further embodiment of the present invention images can be obtained using a monosheet imaging element comprising on a transparant support in the order given said base layer, said photosensitive layer, a pigment layer and a receiving layer. After information-wise exposure and subsequent development of the imaging element the non-hardened or insufficiently hardened parts of the photosensitive layer will penetrate into the pigment layer and will be transferred together with said pigment layer to the receiving layer. The receiving layer is e.g. paper or polyester film, By the term transferred should be understood that the photosensitive layer together with the pigment layer adheres to the receiving layer. After said thermal transfer step the receiving layer is peeled apart from the imaging element.

In the present embodiment it is important that the pigment layer is sufficiently porous to allow the penetration of the non-hardened parts or insufficiently hardened parts of the photosensitive layer. For this reason the amount of binder in the pigment layer should be kept as low as possible. Preferably the amount of pigment constitutes at least 30% by weight of the pigment layer. Most preferably the pigment layer does not contain a binder.

Pigments suitable for use in accordance with the present embodiment are the pigments mentioned above.

The support of the imaging element preferably has a thickness between 3 $\mu$m and 60 $\mu$m. Such is important for contact exposures but is less important for exposures with laser light sources because the latter can be focussed in the photosensitive layer.

According to a variant of the present embodiment a layer similar to the base layer is provided between the pigment layer and the image receiving layer. After information wise exposure and development the imaging element according to this variant is overall exposed to actinic radiation so that the transferred parts; of the photosensitive layer are hardened and the adherence of the transferred parts to the image receiving material is enhanced which facilates their peeling apart.

According to another embodiment of the present invention an image can also be made by heating an image-wise exposed imaging element comprising the photopolymerizable composition used in accordance with the present invention as an outermost layer to a temperature sufficient for obtaining the non-exposed or insufficiently exposed parts tacky while the exposed areas due to photopolymerization do not become tacky. In a subsequent powdering with a dye pigment e.g. carbon black the image can be developed since said dye pigment will stick to the tacky parts of the heated imaging element. After cooling the powdered imaging element to room temperature the imaging element is advantageous overall exposed to harden the powdered parts. An image of good quality and high contrast can be obtained. According to a variant of this embodiment the powdering may be carried out by laminating a sheet containing pigment powder and subsequently removing said sheet.

The present invention is illustrated by the following examples without however limiting it thereto. All parts are by weight unless otherwise specified.

EXAMPLE 1

A comparative imaging element was prepared as follows. A subbed polyethylene terephtalate support having a thickness of 100 $\mu$m was coated by means of a knife coater with an organic photochemical imaging composition consisting of a solution in methyl-ethyl keton of 2% by weight of compound 1 and 2% of compound 2 mentioned above, 0.66% by weight of a blue dye (C.I. 61551), 0.02% by weight of a polysiloxane polyether copolymer sold under the trade mark TEGO-GLIDE 410 by TH. GOLDSCHMIDT AG, D-4300 Essen 1, Goldschmidtstrasse 100, Germany, 3.5% by weight of bis-imidazole, 0.1% by weight of Michler's ketone, and 0.2% by weight of mercaptobenzoxazole.

The mixture was coated to form a layer having a thickness in dry conditions of 1 g/m$^2$.

An imaging element was prepared according to the invention similar to the comparitive example except that the polyethylene therephthalate support was first coated with a base layer of polyvinyl alcohol of which 25 mol % of the hydroxyl groups were modified with methacryloylchloride to a thickness of 0.5 g/m$^2$ under dry conditions before applying the photochemical imaging composition.

2 identical receiving elements were prepared as follows. To 418 g of a dispersion containing 21.5% of TiO$_2$ (average particle size 0.3 to 0.5 μm) and 2.5% of polyvinyl alcohol in deionized water were subsequently added, while stirring, 220 g of a 5% polyvinyl alcohol solution in water, 95 g of a hydrolyzed 22% tetramethyl orthosilicate emulsion in water and 22 g of a 10% solution of a wetting agent. To this mixture was then added 245 ml of deionized water and the pH was adjusted to pH=4.

The resulting dispersion was coated on a polyester (coated with a hydrophilic adhesion layer) support to a wet coating thickness of 55 g/m$^2$ and dried at 30° C.

The imaging elements described above were placed in contact with a test target and a 150 lines per inch screen and exposed therethrough to ultraviolet radiation.

Each of the exposed imaging elements was then placed in face-to-face contact with a hydrophilic receiving element prepared as described above.

The contacting elements were conveyed through a roll laminator device at 165° C. and a speed of 1.54 m/min. Next, the elements were peeled apart.

The comparitive sample showed a good dot reproduction up to dot sizes of 80% while the sample according to the invention could reproduce dot sizes of upto 90%.

The obtained image on the receiving elements could be used to print on a conventional offset press using a commonly employed ink and fountain. Good copies were obtained with the sample according to the invention. The quality of the copies obtained with the comparitive sample was inferior to the sample according to the invention.

EXAMPLE 2

A comparative imaging element was prepared as follows. A subbed polyethylene terephtalate support having a thickness of 100 μm was coated with a base layer of polyvinyl alcohol to a thickness of 1.5 g/m$^2$ and an organic photochemical imaging composition consisting of a solution in methyl-ethyl keton of 2% by weight of compound 3 and 2% of compound 4 mentioned above, 0.66% by weight of a blue dye (C.I. 61551), 0.02% by weight of a polysiloxane polyether copolymer sold under the trade mark TEGOGLIDE 410 by TH. GOLDSCHMIDT AG, D-4300 Essen 1, Goldschmidtstrasse 100, Germany, 3.5% by weight of bisimidazole, 0.1% by weight of Michler's ketone, and 0.2% by weight of mercaptobenzoxazole. The mixture was coated to form a layer having a thickness in dry conditions of 3.5 g/m$^2$.

An imaging element was prepared according to the invention similar to the comparitive example except that the base layer was replaced by a base layer of polyvinyl alcohol of which 25 mol % of the hydroxyl groups were modified with methacryloyl chloride.

2 identical receiving elements were prepared as described in example 1.

The imaging elements described above were placed in contact with a test target and a 150 lines per inch screen and exposed therethrough to ultraviolet radiation.

Each of the exposed imaging elements was then placed in face-to-face contact with a hydrophilic receiving element prepared as described above.

The contacting elements were conveyed through a roll laminator device at 186° C. and a speed of 2.12 m/min. Next, the elements were peeled apart.

The comparitive sample showed a good dot reproduction upto dot sizes of 70% while the sample according to the invention could reproduce dot sizes of upto 97%.

The obtained image on the receiving elements could be used to print on a conventional offset press using a commonly employed ink and fountain. Good copies were obtained with the sample according to the invention. The quality of the copies obtained with the comparitive sample was inferior to the sample according to the invention.

EXAMPLE 3

An imaging element was prepared similar to the imaging element according to the invention described in example 1 with the exception however that compounds 5 and 6 mentioned above were used in an amount of 3% and 1% respectively instead of compounds 1 and 2 and the thickness of the base layer was increased to 1 g/m$^2$.

The imaging element was exposed and processed as described in example 1 with the exception that the temperature and speed during transfer were respectively 175° C. and 1.02 m/min.

A good dot reproduction up to dot sizes of 95% was obtained.

The obtained image on the receiving element could be used to print on a conventional offset press using a commonly employed ink and fountain. Good copies were obtained with the sample according to the invention.

EXAMPLE 4

An imaging element was prepared as follows. To a subbed polyethylene terephthalate support having a thickness of 100 μm was coated a base layer of polyvinyl alcohol of which 25 mol % of the hydroxyl groups were modified with methacryloyl chloride with a dry thickness of 2 g/m$^2$, a photosensitive composition as described in example 3 with a dry thickness of 1 g/m$^2$ and a pigment layer coated from an aqueous solution containing 2.5% of silver sol (Carey lea) to a dry thickness of 2.5 g/m$^2$.

The thus obtained imaging element was exposed and processed as in example 1 with the exception that the transfer temperature was 175° C. and the speed 0.36 m/min.

An image of good resolution was obtained.

EXAMPLE 5

An imaging element was prepared similar to the imaging element described in example 4 with the exception that the pigment layer was replaced by a pigment layer coated from an aqueous solution containing 24% of Fe$_3$O$_4$ pigments and 1.2% of modified silica particles (Bentone LT commercially available from Krauss). The dry thickness of the pigment layer was 1.5 g/m$^2$.

The thus obtained imaging element was image-wise exposed as described in example 1 and subsequently placed in face to face contact with a polyethylene terephthalate support as the image receiving material.

The contacting elements were conveyed through a roll laminator device at 180° C. and a speed of 0.36 m/min. Next, the elements were peeled apart.

An image of good resolution was obtained.

EXAMPLE 6

An imaging element was prepared similar to the imaging element described in example 4 with the exception that the thickness of the photosensitive layer was 2 g/m² and the pigment layer was replaced by a pigment layer coated from an aqueous solution containing 5% of Carbon black pigments. The dry thickness of the pigment layer was 0.5 g/m².

The thus obtained imaging element was image-wise exposed as described in example 1 and subsequently placed in face to face contact with a polyethylene terephthalate support as tile image receiving material.

The contacting elements were conveyed through a roll laminator device at 180° C. and a speed of 0.36 m/min. Next, the elements were peeled apart.

An image of good resolution was obtained.

EXAMPLE 7

An imaging element was prepared similar to example 6 with the exception however that the pigment layer was replaced by a pigment layer coated from an aqueous solution containing 5% of a carbon black pigment and 0.5% of polyethylene latex particles.

The thus obtained imaging element was exposed and processed as described in example 6. An image having a good resolution was obtained.

We claim:

1. An imaging element comprising on a support a photosensitive layer containing a photopolymerizable composition, a base layer located between said support and said photosensitive layer wherein said base layer is contiguous to said photosensitive layer and comprises a polymer containing polymerizable ethylenically unsaturated groups and a porous layer containing a pigment on top of said photosensitive layer.

2. An imaging element according to claim 1 wherein said polymer containing polymerizable ethylenically unsaturated groups is a polymer containing hydroxyl groups, carboxyl groups, amino groups, isocyanate groups, epoxy groups, anhydride groups, alkylchloride groups or silanol groups of which at least part have been modified to a polymerizable ethylenically unsaturated group.

3. An imaging element according to claim 1 wherein said polymer containing polymerizable ethylenically unsaturated groups is polyvinyl alcohol of which part of the hydroxyl groups have been modified to a polymerizable ethylenically unsaturated group.

4. An imaging element according to claim 1 wherein said polymerizable ethylenically unsaturated group is an acrylate, methacrylate, vinyl or allyl group.

5. An imaging element according to claim 1 wherein said base layer further comprises a polymerization initiator.

6. An imaging element according to claim 1 wherein said porous layer contains said pigment in an amount of at least 30% by weight.

7. An imaging element according to claim 1 wherein said pigment is carbon black, a color pigment, a magnetic pigment or a metal sol.

8. A method for obtaining an image comprising the steps of:
information-wise exposing an imaging element comprising on a support a photosensitive layer containing a photopolymerizable composition and a base layer located between said support and said photosensitive layer and wherein said base layer is contiguous to said photosensitive layer and comprises a polymer containing polymerizable ethylenically unsaturated groups and a porous layer containing pigment on top of said photosensitive layer,
transferring upon heating the non-hardened or insufficiently hardened parts of said photosensitive layer together with areas of said porous layer overlaying said non-hardened or insufficiently hardened parts of said photosensitive layer to an image receiving material, and
thereafter peeling apart said imaging element and said image receiving material.

9. A method according to claim 8 wherein said receiving element and said imaging element are in contact with each other upon information-wise exposure and are peeled apart after said transferring upon heating.

10. A method according to claim 8 wherein said non-hardened or insufficiently hardened parts of said photosensitive layer are hardened using an overall heating step or an overall exposure to actinic radiation subsequent to their transfer to said image receiving material.

11. A method according to claim 8 wherein said polymer containing polymerizable ethylenically unsaturated groups is a polymer containing hydroxyl groups, carboxyl groups., amino groups, isocyanate groups, epoxy groups, anhydride groups, alkylchloride groups or silanol groups of which at least part have been modified to a polymerizable ethylenically unsaturated group.

12. A method according to claim 11 wherein said polymer containing polymerizable ethylenically unsaturated groups is polyvinyl alcohol of which part of the hydroxyl groups have been modified to a polymerizable ethylenically unsaturated group.

13. A method according to claim 8 wherein said polymerizable ethylenically unsaturated group is an acrylate, methacrylate, vinyl or allyl group.

* * * * *